United States Patent
Goel et al.

(10) Patent No.: US 7,271,616 B2
(45) Date of Patent: Sep. 18, 2007

(54) FPGA-BASED DIGITAL CIRCUIT FOR REDUCING READBACK TIME

(75) Inventors: Ashish Kumar Goel, Benares (IN); Davinder Aggarwal, New Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 125 days.

(21) Appl. No.: 11/190,509

(22) Filed: Jul. 26, 2005

(65) Prior Publication Data
US 2006/0022700 A1 Feb. 2, 2006

(30) Foreign Application Priority Data
Jul. 27, 2004 (IN) .................. 1385/DEL/2004

(51) Int. Cl.
*G06F 7/38* (2006.01)
*H03K 19/173* (2006.01)
(52) U.S. Cl. ..................... 326/37; 326/41; 326/47
(58) Field of Classification Search ............ 326/37–41, 326/46, 47
See application file for complete search history.

(56) References Cited

U.S. PATENT DOCUMENTS

| | | | | |
|---|---|---|---|---|
| 5,394,031 A | * | 2/1995 | Britton et al. | ................ 326/38 |
| 5,426,379 A | * | 6/1995 | Trimberger | ................ 326/39 |
| 6,069,489 A | | 5/2000 | Iwanczuk et al. | |

* cited by examiner

*Primary Examiner*—Anh Q. Tran
(74) *Attorney, Agent, or Firm*—Hogan & Hartson LLP (57) ABSTRACT

An improved digital circuit for reducing readback time in field programmable gate arrays (FPGAs) includes a shift register having a plurality of latches and a clock and a reset signal provided to the latches. An interconnect circuit is provided between each pair of latches of the shift register for providing a selective data frame from the desired latch or latches. Connecting a control signal generator to a control input of said interconnect circuit enables quick readback of selected data frames, thereby reducing the time consumed for debugging of an FPGA.

19 Claims, 7 Drawing Sheets

Figure 1.

PRIOR ART

Figure 2

PRIOR ART

Figure 3

PRIOR ART

FPGA-BASED DIGITAL CIRCUIT FOR REDUCING READBACK TIME

RELATED APPLICATION

The present application claims priority of Indian Patent Application No. 1385/Del/2004 filed Jul. 27, 2004, which is incorporated herein in its entirety by this reference.

FIELD OF THE INVENTION

The present invention relates to a digital circuit for reducing readback time in Field Programmable Gate Arrays (FPGAs), and in general to debugging programmable logic devices.

BACKGROUND OF THE INVENTION

An FPGA typically includes a matrix of Configuration Latches, Configuration Control elements and matrix of Programmable Logic Blocks (PLB's), Routing Blocks and IO blocks. The functioning of each of the Programmable Logic Block is controlled by the Configuration Latches. Configuration Latches data is readback from FPGA to the FPGA controller for debugging the Field Programmable Gate Array. These Configuration Latches are responsible for the functionality implementation and routing between these programmable logic blocks and IO's.

Figure 1:
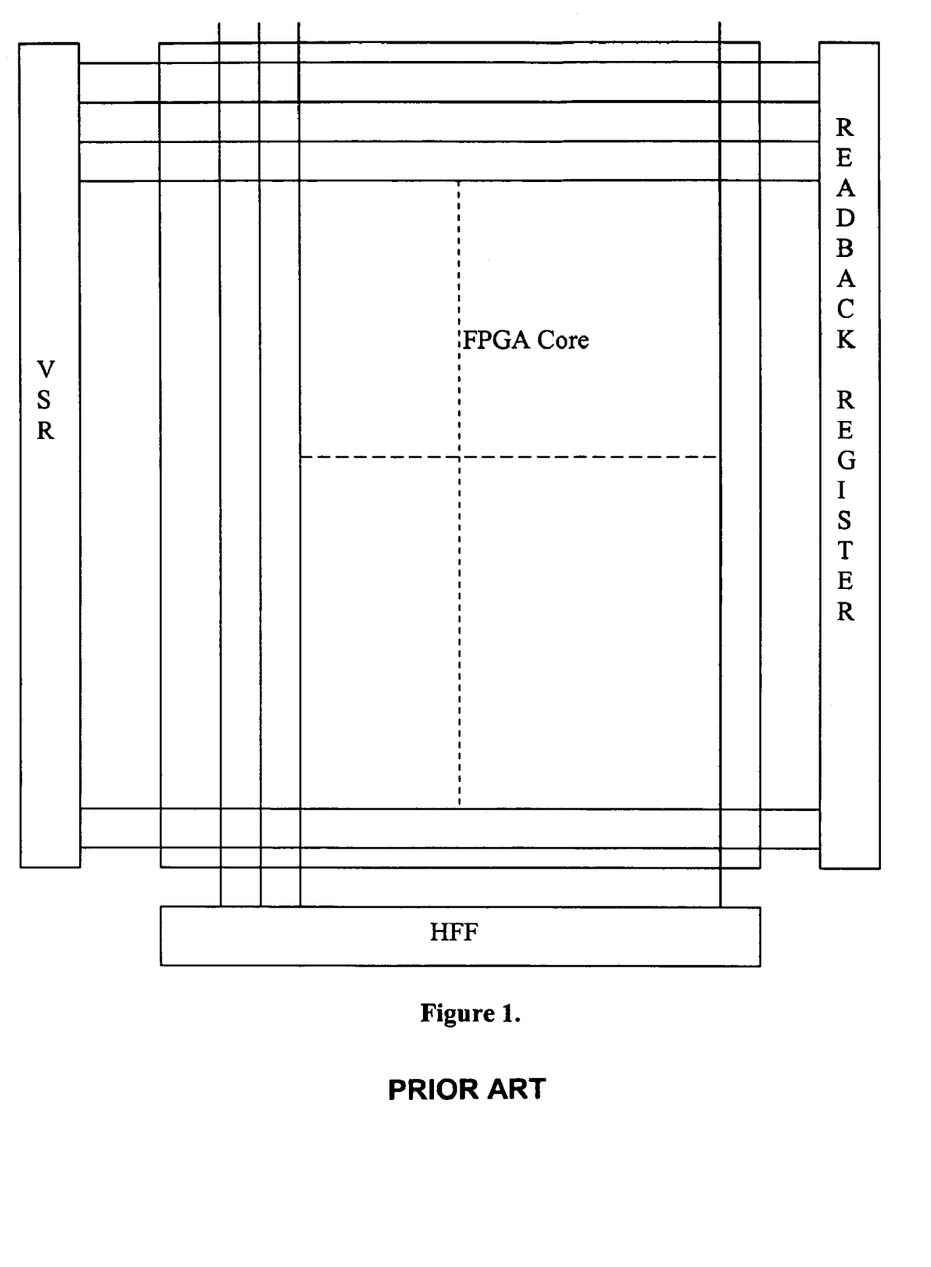
FIG. 1 illustrates the existing structure of Configuration latch matrix with Vertical shift registers (VSR) and Horizontal shift registers (HSR) in an FPGA according to the prior art.

FIG. 1 illustrates the conventional structure of an FPGA with the Configuration latch matrix, Vertical shift registers (VSR), Horizontal shift registers (HSR) and the Readback Register. The figure illustrates the conventional structure used for data readback from configuration latches. The data frames are fed from configuration latches, further data inputs from the Horizontal Shift Registers selects the configuration latches to be Readback and this readback data is used for debugging on the Logic Device.

Figure 2:
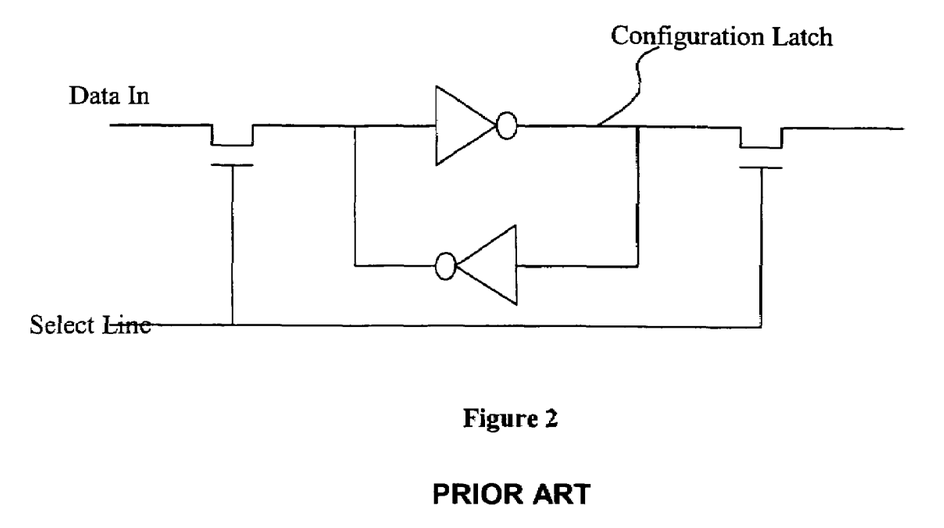
FIG. 2 illustrates an existing configuration latch according to the prior art.

FIG. 2 illustrates the circuit of a conventional Configuration Latch used. It has a select line connected to the NMOS transistor. When this select line is active high the data at input is applied to latch. Similarly the same signal can be used to readback data from the latch. The output of this latch is further used to control the function of FPGA.

As per the prior art described in U.S. Pat. No. 6,069,489, the Readback and Configuration of Latches is done sequentially. The data is outputted on a frame-by-frame basis, thereby increasing time consumed in the overall debugging cycle. The configuration latches are loaded by loading data into the VSR (Vertical shift register) and then enabling select line for transferring the data in VSR to column of configuration latches. This selection of configuration column of latches is done serially by HSR (Horizontal shift register). While configuring the latches the HSR serially enables the configuration lines. First the configuration data is loaded frame wise in the VSR (Vertical Shift Register) and then the select line of HSR is enabled which selects a column of configuration latches. After the select line enabled the data from VSR is transferred to column of configuration latches.

For readback, the HSR enables select line in serial fashion and the data from configuration latches is transferred to readback registers, from where the data is serially streamed out. Thus if readback of any specific frames required for testing an application, time would be consumed to stream all the frames sequentially, thereby lengthening the Readback time.

Figure 3:
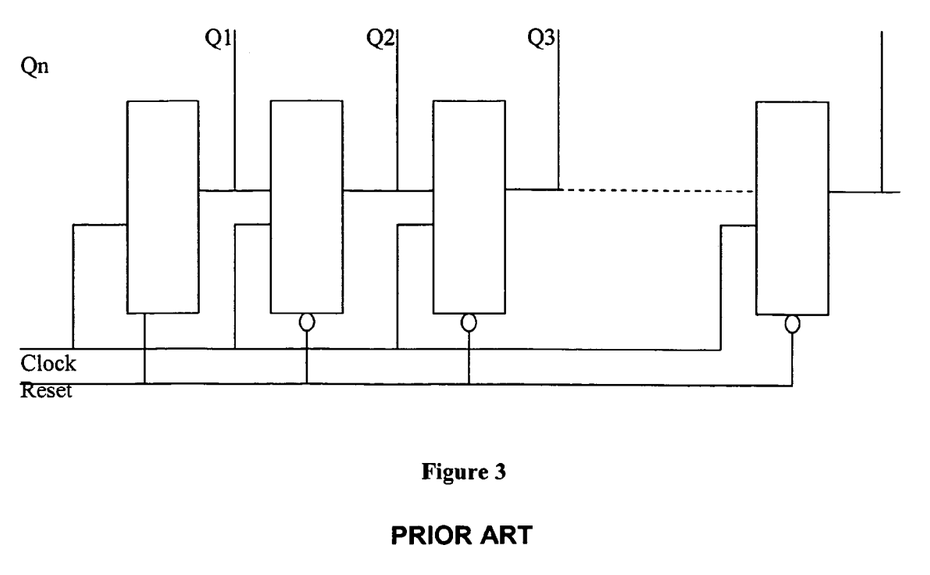
FIG. 3 illustrates a prior art Horizontal Shift Register structure.

FIG. 3 shows the Horizontal Shift Register (HSR) used in prior art. The flip-flops are arranged as a serial shift register manner. During the configuration start operation the reset signal is generated. This reset signal sets the first Flip-flop, while reset all others. Thus enabling the first select line. As stated in prior art whenever the data has to be transferred from VSR to configuration latches the select line has to be enabled, which is provided by this HSR. When one frame of data from VSR is transferred then new data is loaded into VSR and clock is provided to HSR thus enabling next column of configuration latches.

HSR is also used for partial configuration. In partial configuration only few columns of configuration latches are required to be loaded. After resetting HSR the shifting of set bit is done, till desired column is reached. After which HSR is enabled thus enabling the corresponding columns of latches, which are loaded with the data in VSR.

The Problem in prior art is that the time consumed for readback data frames is substantial due to the sequential transfer of the data frames. Further, the complete shifting of the HSR is required for Readback.

A need is therefore felt for an improved digital circuit, to eliminate sequential implementation of Readback, for ultimately reducing the debugging time of an FPGA.

SUMMARY OF THE INVENTION

It is an object of present invention to provide an improved digital circuit in FPGA for reducing readback time.

It is another object of the present invention to introduce interconnect circuits between the registers of the Horizontal Shift Register, for implementing readback of data frames in reduced time.

It is yet another objective of the present invention to implement selection of desired latch/latches to output a particular data frame for Readback.

To achieve the above said objectives the present invention provides a digital circuit in FPGA for reducing readback time which includes a shift register having a plurality of latches, a clock and a reset signal being provided to said latches wherein one interconnect circuit is provided between each pair of latches of said shift register for providing selective data frame from the desired latch/latches, and a control signal generator connected to a control input of said interconnect circuit to enable read back of said selected frames in reduced time.

Further, the present invention provides a method for reducing readback time in FPGA which includes the steps of inputting the data to a first latch of the shift register, applying the clock and reset signals to plurality of latches of the shift register, outputting the data from first latch to an interconnect circuit and subsequent interconnect circuits between each pair of said latches of the shift register, selecting the desired latch/latches through the interconnect circuits enabled by a control signal generator for selection of a particular data frame/frames, and outputting the selected data frame for read back in reduced time.

The instant invention thereby provides an improved digital circuit in FPGA for reducing readback time.

BRIEF DESCRIPTION OF THE DRAWINGS

The present invention will now be described with reference to and as illustrated with reference to the accompanying drawings.

DETAILED DESCRIPTION

Figure 4:
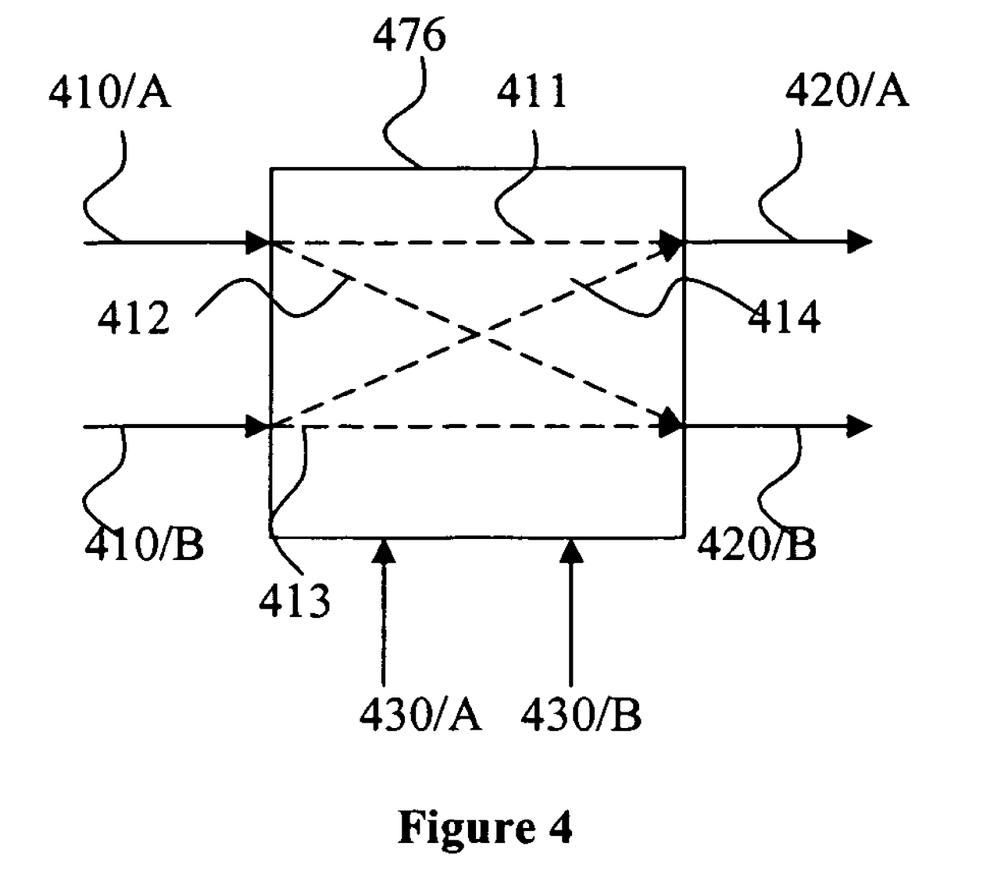
FIG. 4 illustrates a 2×2 interconnect circuit used in the instant invention.

FIG. 4 shows an interconnect circuit used in the instant invention. This interconnect circuit is a 2×2 Switch Matrix (476). The switch matrix has two inputs (410/A) and (410/B) and two outputs (420/A) and (420/B) providing four different paths (413) from (410/B) to (420/B), path (414) from (410/B) to (420/A), path (411) from (410/A) to (420/A) and path (412) from (410/A) to (420/B) to connect the inputs and outputs. The switch matrix also contains selection means (430/A) and (430/B) to select one of the four available paths to from input to output.

Figure 5:
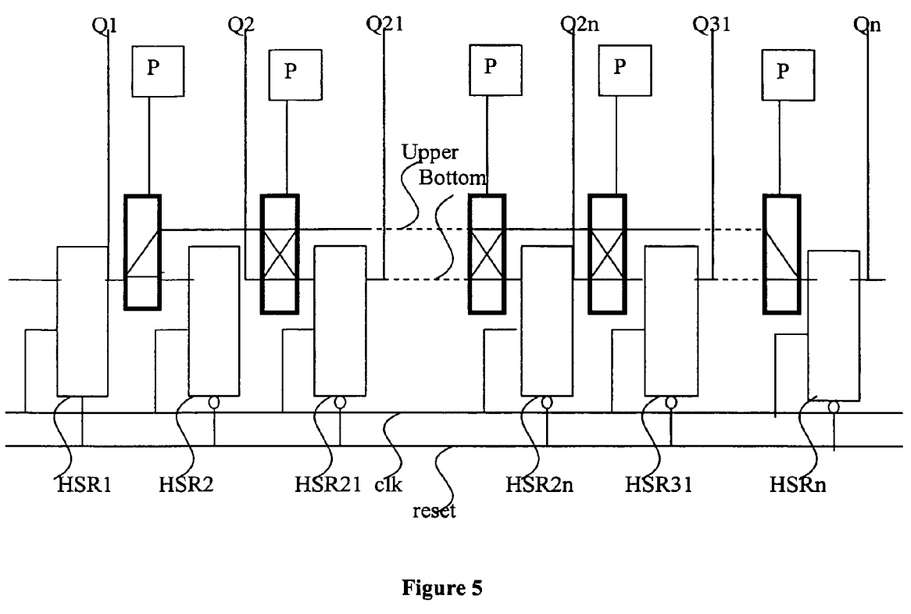
FIG. 5 illustrates a Horizontal Shift Register with interconnect circuit used in the instant invention.

FIG. 5 shows the improved Horizontal Shift Register (HSR) with the interconnect circuit, as per the instant invention. It is assumed that the configuration memory frames of logic blocks and routing block lines to be Readback for debugging are latched by latches, wherein the latches are selected by the control signals.

At the input of the HSR one demultiplexer or 1×2 switch matrix is used that is connected between the first two latches. This demultiplexer can be used to shift select line from the latch (HSR1) to latch (HSR2) or it can skip latch (HSR2), using an upper select line. As per the figure above there are options for selection of paths for shifting data within the Horizontal Shift Register. Similarly, a 2×1 multiplexer or switch matrix is connected between the last two latches at the output of the Horizontal Shift Register. One 2×2 switch matrix is connected between each pair of the remaining latches for selecting or skipping a particular latch from the remaining latches of the shift register.

As illustrated in FIG. 5, the control of these switches is through program bits. These program bits can be loaded during initial configuration of the FPGA, after which whenever the partial configuration of FPGA is required then the selected frames can be configured. Thus before configuration it has to be decided which frames are required for partial configuration.

Similarly after initial configuration or after partial configuration the program bits for HSR can be set such that only selected frames can be Readback.

Figure 6:
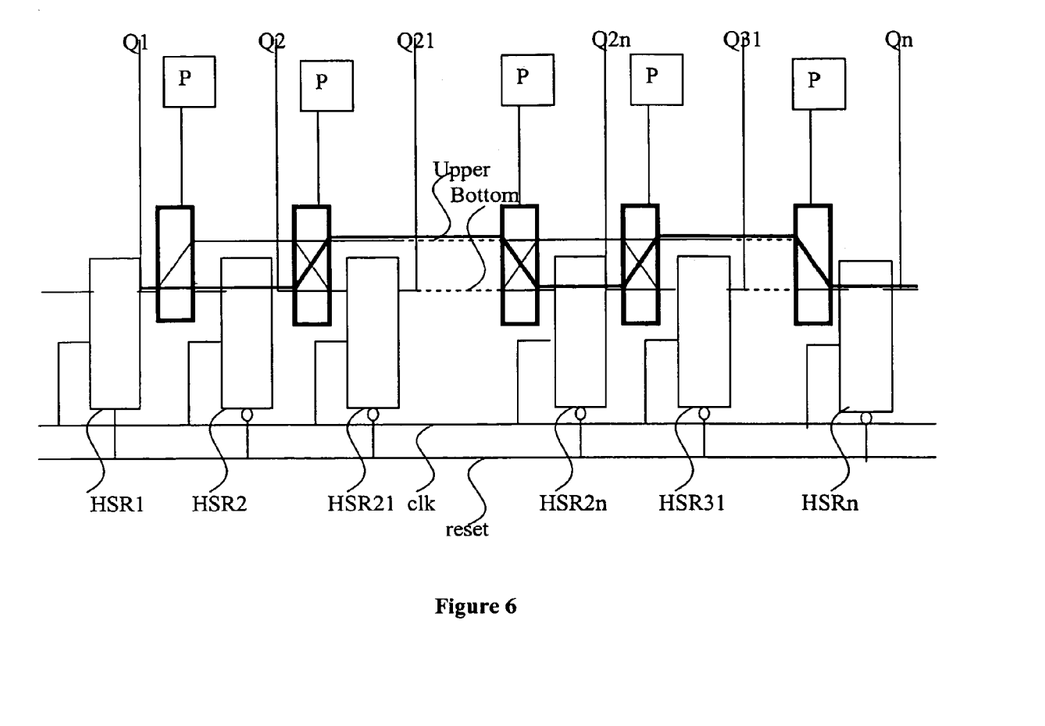
FIG. 6 illustrates one path for readback selective data frame from configuration latches in the instant invention.
Figure 7:
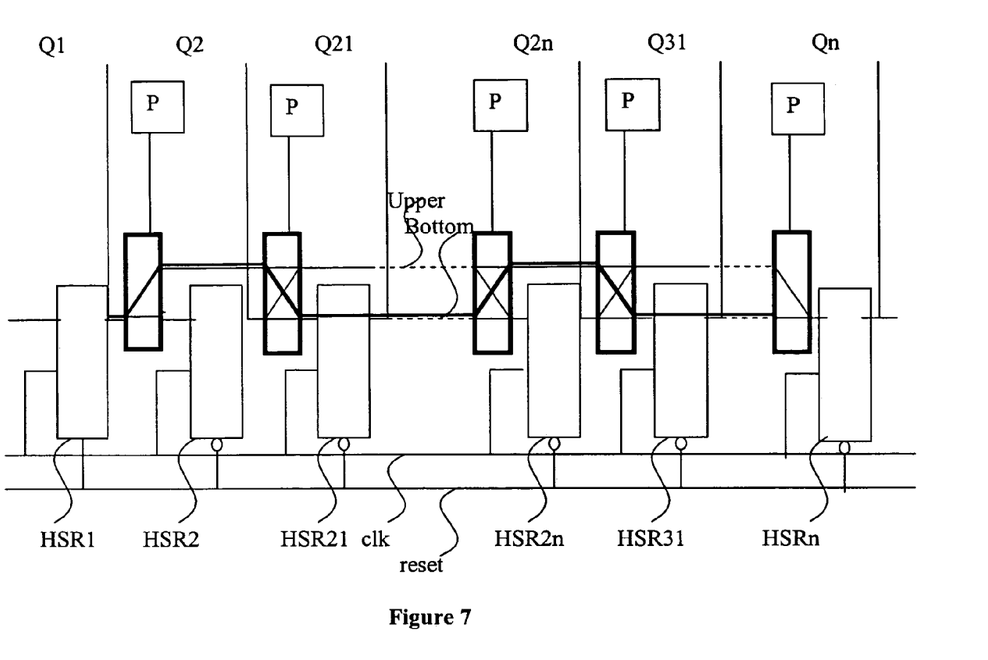
FIG. 7 illustrates another path for readback selective data frame from configuration latches in the instant invention.

Thus it can be seen that we can enable the latches (HSR) to (HSRn) selectively, as shown in FIG. 6, or we can also enable all the select lines in between the latch (HSR) and latch (HSRn). It can be therefore observed that latches (HSR1) and (HSRn−1) can be selected using the combination of these 2×2 switches as also shown in FIG. 7. The schemes in FIG. 6 and FIG. 7 can be used in combination to implement required readback of data frames.

Hence the main advantage of this scheme is that the time required to read back the desired frames reduces. Thus, if the user requires to readback a particular set of data frames, then it can be achieved by using the digital circuit used in the present invention.

Another advantage of the present invention is scheme thus useful for reducing time for partial configuration of the Field Programmable Gate Array, by using selective latches for data frame readback.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A digital circuit in an FPGA for reducing readback time comprising:
   a shift register having a plurality of latches, a clock and a reset signal being provided to said latches;
   an interconnect circuit between each pair of latches of said shift register for providing a selective data frame from the desired latch/latches; and
   a control signal generator coupled to a plurality of independent control inputs of said interconnect circuit to enable read back of said selected frames in reduced time.

2. The digital circuit of claim 1 wherein said interconnect circuit comprises a 1×2 switch matrix, a 2×1 switch matrix or a 2×2 switch matrix.

3. The digital circuit of claim 2 wherein the 1×2 switch matrix is coupled between a first two of the plurality of latches, the 2×1 switch matrix is coupled between a last two of the plurality of latches, and the 2×2 switch matrix is coupled between the remaining latches of said shift register.

4. The digital circuit of claim 2 wherein the 1×2 switch matrix comprises a demultiplexer.

5. The digital circuit of claim 2 wherein the 2×1 switch matrix comprises a multiplexer.

6. A method for reducing read back time in FPGA comprising:
   inputting data to a first latch of a shift register;
   applying clock and reset signals to plurality of latches of the shift register;
   outputting data from the first latch to an interconnect circuit and subsequent interconnect circuits between each pair of said latches of the shift register;
   selecting the desired latch or latches through the interconnect circuits individually enabled by a control signal generator for selection of a particular data frame or frames; and
   outputting a selected data frame for read back in reduced time.

7. A digital circuit in an FPGA comprising:
a shift register including a plurality of latches, each latch including a data input, a data output, a clock input, and a reset input, wherein the clock inputs are coupled together for receiving a clock input signal, and the reset inputs are coupled together for receiving a reset signal; and
an interconnect circuit including a plurality of switches for coupling the data output of an Nth latch in the plurality of latches to an (N+1)th latch in the plurality of latches, or for individually bypassing the plurality of latches.

8. The digital circuit of claim 7 wherein a first of said plurality of switches comprises a 1×2 switch.

9. The digital circuit of claim 7 wherein a last of said plurality of switches comprises a 2×1 switch.

10. The digital circuit of claim 7 wherein said plurality of switches comprises a plurality of 2×2 switches.

11. The digital circuit of claim 7 further comprising:
an upper line for coupling an upper switch output of an Nth switch to an upper switch input of an (N+1)th switch.

12. The digital circuit of claim 7 further comprising: a bottom line for coupling a bottom switch output of an Nth switch to a bottom switch input of an (N+1)th switch.

13. The digital circuit of claim 7, wherein at least one of the plurality of switches comprises first and second selection control inputs.

14. A digital circuit in an FPGA for reducing read back time comprising:
a shift register having a plurality of latches, a clock and a reset signal being provided to said latches;
an interconnect circuit between each pair of latches of said shift register for providing a selective data frame from the desired latch/latches, said interconnect circuit comprising a 1×2 switch matrix coupled between a first two of the plurality of latches, a 2×1 switch matrix coupled between a last two of the plurality of latches, or a 2×2 switch matrix coupled between the remaining latches of said shift register; and
a control signal generator coupled to a control input of said interconnect circuit to enable read back of said selected frames in reduced time.

15. A digital circuit in an FPGA for reducing readback time comprising:
a shift register having a plurality of latches, a clock and a reset signal being provided to said latches;
an interconnect circuit between each pair of latches of said shift register for providing a selective data frame from the desired latch/latches, said interconnect circuit comprising a 1×2 switch matrix comprising a demultiplexer, a 2×1 switch matrix, or a 2×2 switch matrix; and
a control signal generator coupled to a control input of said interconnect circuit to enable read back of said selected frames in reduced time.

16. A digital circuit in an FPGA comprising:
a shift register including a plurality of latches, each latch including a data input, a data output, a clock input, and a reset input, wherein the clock inputs are coupled together for receiving a clock input signal, and the reset inputs are coupled together for receiving a reset signal; and
an interconnect circuit including a plurality of switches for coupling the data output of an Nth latch in the plurality of latches to an (N+1)th latch in the plurality of latches, or for selectively bypassing at least one of the plurality of latches, wherein said plurality of switches comprises a plurality of 2×2 switches.

17. A digital circuit in an FPGA comprising:
a shift register including a plurality of latches, each latch including a data input, a data output, a clock input, and a reset input, wherein the clock inputs are coupled together for receiving a clock input signal, and the reset inputs are coupled together for receiving a reset signal;
an interconnect circuit including a plurality of switches for coupling the data output of an Nth latch in the plurality of latches to an (N+1)th latch in the plurality of latches, or for selectively bypassing at least one of the plurality of latches; and
an upper line for coupling an upper switch output of an Nth switch to an upper switch input of an (N+1)th switch.

18. A digital circuit in an FPGA comprising:
a shift register including a plurality of latches, each latch including a data input, a data output, a clock in put, and a reset input, wherein the clock inputs are coupled together for receiving a clock input signal, and the reset inputs are coupled together for receiving a reset signal;
an interconnect circuit including a plurality of switches for coupling the data output of an Nth latch in the plurality of latches to an (N+1)th latch in the plurality of latches, or for selectively bypassing at least one of the plurality of latches; and
a bottom line for coupling a bottom switch output of an Nth switch to a bottom switch input of an (N+1)th switch.

19. A digital circuit in an FPGA comprising:
a shift register including a plurality of latches, each latch including a data input, a data output, a clock input, and a reset input, wherein the clock inputs are coupled together for receiving a clock input signal, and the reset inputs are coupled together for receiving a reset signal; and
an interconnect circuit including a plurality of switches for coupling the data output of an Nth latch in the plurality of latches to an (N+1)th latch in the plurality of latches, or for selectively bypassing at least one of the plurality of latches, wherein at least one of the plurality of switches comprises first and second selection control inputs.

* * * * *